United States Patent [19]

Tanaka et al.

[11] 4,119,854
[45] Oct. 10, 1978

[54] ELECTRON BEAM EXPOSURE SYSTEM

[75] Inventors: Kazumitsu Tanaka; Nobuo Goto, both of Tokyo, Japan

[73] Assignee: Nihon Denshi Kabushiki Kaisha, Tokyo, Japan

[21] Appl. No.: 852,435

[22] Filed: Nov. 17, 1977

[30] Foreign Application Priority Data

Nov. 25, 1976 [JP] Japan .................. 51-141415

[51] Int. Cl.² ........................................... H01J 37/00
[52] U.S. Cl. ............................... 250/397; 250/398; 250/492 A
[58] Field of Search .............. 250/306 R, 397, 398, 250/492 A, 440, 442; 313/361; 219/121 EB, 121 EM

[56] References Cited

U.S. PATENT DOCUMENTS

| | | | |
|---|---|---|---|
| 3,699,334 | 10/1972 | Cohn et al. | 250/492 A |
| 3,849,659 | 11/1974 | O'Keeffe | 250/492 A |
| 3,894,271 | 7/1975 | Pfeiffer et al. | 250/492 A |
| 3,922,546 | 11/1975 | Livesay | 250/492 A |

Primary Examiner—Alfred E. Smith
Assistant Examiner—B. C. Anderson
Attorney, Agent, or Firm—Webb, Burden, Robinson & Webb

[57] ABSTRACT

A reference mark, common to both an electron beam and a workpiece, is arranged above and away from, but in the vicinity of, the workpiece exposure area. The position of the workpiece with respect to the reference mark is ascertained by an optical measuring means such as a Michelson type laser interferometer and the position of the electron beam with respect to the reference mark is ascertained by scanning the electron beam over said reference mark. The relative positions of the electron beam and the exposed workpiece is obtained by comparing the respective positions of the electron beam and workpiece with the reference mark. By so doing, the error between specified and actual positions of the points of impingement of the electron beam on the surface of the workpiece may be corrected.

8 Claims, 5 Drawing Figures

ELECTRON BEAM EXPOSURE SYSTEM

This invention relates in general to an electron beam exposure system and in particular to a system capable of detecting the relative positional change of the electron beam and the exposed workpiece.

An electron beam exposure system is a very effective means for exposing minute patterns on a selected target or workpiece in order to produce semi-conductor circuit elements; for example, IC, LSI and ultra LSI components. A general discussion of electron beam technology as it applied to microcircuit fabrication may be found in the 1974 *McGraw-Hill Yearbook of Science and Technology*, pp. 289–291, McGraw-Hill 1974.

Inscribing even a minute pattern on a workpiece with the aid of an electron beam exposure system takes several hours to complete, during which time high operational accuracy and stability are of the utmost importance. However, the required degree of accuracy and stability are virtually impossible to achieve due to such factors as heat variations in the various parts constituting the electron beam generating source and parts adjacent to the beam path, external magnetic fields, and dust particles adhering to parts in the vicinity of the beam which cause a build-up of electric charges resulting in electric field asymmetry. Consequently, as time passes, drift from the assigned positions of the electron beam and also that of the stage on which the workpiece is mounted gradually takes place. The error, thus resulting, between the specified and actual positions of the electron beam irradiating the surface of the workpiece precludes the degree of accuracy required for effective exposure. The relative drift of the electron beam and workpiece can be measured by utilizing a mark fixed to the workpiece or workpiece stage, but this method is not practical because it is time consuming. Moreover, this method of measurement cannot be effected at all times during exposure because it is necessary to shift the workpiece or stage to change the area of exposure.

Accordingly, the prime object of this invention is to provide an electron beam exposure system capable of measuring the drift in the positions of the electron beam and the stage by utilizing a fixed reference mark, said fixed reference mark being common to both said electron beam and stage.

Another object of this invention is to provide an electron beam exposure system capable of measuring, in a short time, the change in the relative positions of the electron beam and stage at all times during exposure.

Briefly, according to this invention, there is provided an electron beam exposure system useful in microcircuit fabrication and the like in which two types of drift are compensated. Specifically, electron beam drift and workpiece stage drift are detected and compensated for by repositioning the workpiece stage and/or adjusting the electron optical system. In a typical electron exposure system including a beam source, an electron optical system for converging and deflecting the electron beam, an automatic positionable workpiece stage and a controller for positioning the electron beam and the workpiece stage, there is provided a reference mark positioned in the vicinity of the workpiece exposure area fixed relative to the electron optical system. A first measuring device measures the distance from the reference mark to some reference point in the electron beam raster by scanning the beam over the reference mark. For example, a counter arranged to receive clock pulses may be actuated when the electron beam commences its sweep in say the X-direction, and the counter may be deactivated when the beam is detected over the reference mark. If the optical system remains unchanged over a period of time, i.e., no electron beam drift, the clock pulse count should remain unchanged. A change in clock pulse count is indicative of an electron beam position drift. A second measuring device, preferably a laser interferometer, measures the distance from the workpiece stage to the reference mark. The outputs of the first and second measuring devices are combined and the combination is compared to a reference signal, for example, the combined outputs of the first and second devices at the start of the workpiece exposing process. An error signal may be generated if there is a difference between the output of the combining circuit and the reference signal. Means associated with the control adjust either the electron optical system and/or the workpiece stage position to eliminate the error signal.

The following describes the subject invention in detail in conjunction with the accompanying drawings of which:

Figure 1:
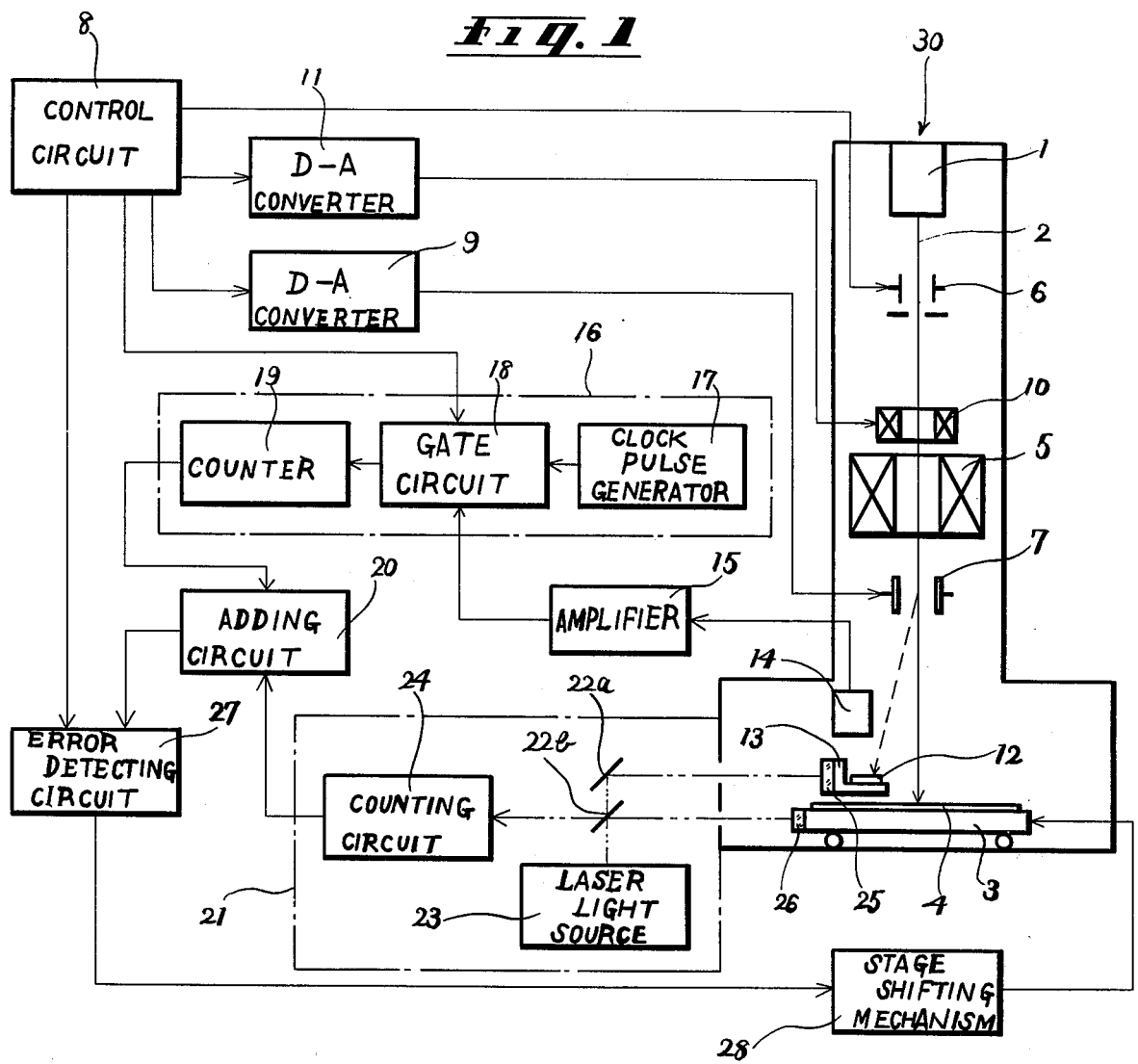
FIG. 1 is a schematic drawing showing one embodiment of the invention.

In FIG. 1 showing one embodiment of this invention, a vacuum column 30 houses an electron beam generating source 1 for generating an electron beam 2. A stage 3 accommodates a workpiece 4. A condenser lens 5 finely focuses said electron beam 2 on said workpiece 4. A blanking device 6 intermittently blanks the electron beam, and a deflector 7 deflects the electron beam in one or two dimensions during the non-blanking period to scan the specified area of the workpiece intended for exposure. A control circuit 8 comprises a computer, computer interface and scanning signal generator. The computer controls the entire exposure system. That is to say, the control circuit 8 supplies a blanking signal to the blanking device 6 and a scanning signal to the deflector 7 via a D-A convertor 9, in accordance with the area of the workpiece intended for exposure. The control signals assign the beam position on the workpiece assuming the stage is accurately positioned. Additionally, the control circuit 8 supplies excitation current to an auxiliary lens 10 via a D-A convertor 11 during the period when the error attributable to the change or drift in the positions of the electron beam 2 from the assigned positions and/or the position of the stage 3 is being measured.

A reference mark 12 is affixed to a glass (or any material having a small coefficient of heat expansion) support bracket 13, said support bracket 13 being substantially fixed to a vital part of the electron optical system; for example, the condenser lens 5, to lie above and away from, but in the vicinity of the workpiece exposure area. The reference mark 12 is scanned by the electron beam 2 during the time when said errors attributable to the drift in the positions of the electron beam and stage are being measured. Backscattered or secondary electrons generated from said reference mark, resultant upon electron beam irradiation, are detected by a detector 14 and amplified as a detection signal by an amplifier 15, prior to being sent to a mark position detecting circuit 16. Said mark position detecting circuit 16 comprises a clock pulse generator 17, a gate circuit 18 and a counter 19 of which the clock pulse generator 17 continuously supplies clock pulses to the gate circuit 18. The control circuit 8 suplies a signal to said gate circuit, said signal being synchronized with the scanning of the electron beam. At the same time as the detection signal is supplied to said gate circuit from the amplifier 15, the gate circuit 18 is opened by the control circuit 8 and closed by the amplifier 15. The counter 19 counts the pulses corresponding to the mark position signal supplied from said gate circuit. The mark position signal thus obtained, is fed into an adding circuit 20 together with a signal from a laser interferometer 21 corresponding to the stage position (i.e., the amount of stage displacement with respect to the reference mark 12). More specifically, the interferometer 21, being a Michelson type interferometer and comprising an opaque mirror 22a and semi-translucent mirror 22b, a laser light source 23 and a counting circuit 24, is disposed so as to measure the amount of displacement between mirrors 25 and 26 which are fixed to the support bracket 13, and the workpiece stage 3 respectively.

The two signals (i.e., the signal from the laser interferometer 21, and the mark position signal), after being added in said adding circuit 20, are sent to an error detecting circuit 27 along with a reference signal from the control circuit 8. The reference signal is based upon the initial beam position and stage position. The error signal obtained therein; i.e., the difference between the reference signal and the output from the adding circuit 20, is supplied to the stage shifting mechanism 28, in order to compensate for stage displacement. That is to say, the error signal removes the error component so as to bring the stage back to its original position relative to the electron beam.

Figure 2:
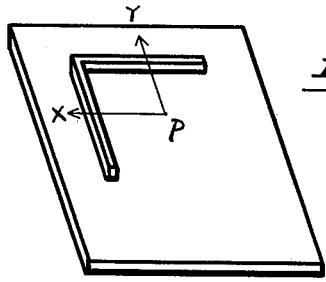
FIG. 2 is an enlarged and explanatory drawing of the reference mark and part of the embodiment shown in FIG. 1, FIGS. 3(a) and (b) are drawings for explaining the operation of the embodiment according to FIG. 1.
Figure 3A:
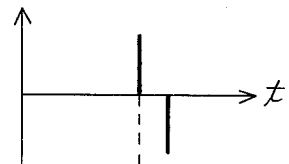
Figure 3B:
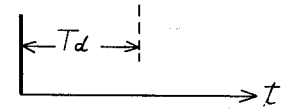

In the embodiment according to FIG. 1, the control circuit 8 carries out error measurement either at fixed intervals or as necessary. To be specific, control circuit 8 sends a blanking signal to the blanking device 6 to suspend the exposure of the workpiece when the beam would be directed thereupon but not when the beam reaches the vicinity of the reference marker. The control circuit sends a predetermined deflection signal to deflector 7 so as to shift the electron beam 2 to a reference point in the vicinity of the reference mark 12. Furthermore, in order to compensate for the difference in distance between the condenser lens 5 and the reference mark 12, and the condenser lens 5 and the workpiece 4, the auxiliary lens 10 is excited so as to accurately converge the electron beam on the reference mark 12. The reference mark 12, for example, as shown in FIG. 2, is L-shaped and etched on the base plate of the support bracket 13. The electron beam 2 having reference point P as its starting point, sequentially scans the protruding reference mark 12 so as to cross the two arms of the mark (i.e., in the X and Y directions). As the electron beam reaches and passes through the outer edge of the mark, the signal from the detector 14 varies to a great extent as shown in FIG. 3(a). Subsequently, the mark position detecting circuit 16 detects the phase difference T$d$ based on said detection signal and the signal from the control circuit 8 as shown in FIG. 3(b) which is synchronized with the commencement of the electron beam scanning. If the electron beam scanning commences from the predetermined reference point P, the specified value should be obtained. Actually, however, due to the various factors (heat variations, dust particles, etc.) heretofore referred to, the electron beam is subjected to undesirable deflection and, as such, impinges a point other than the reference point P. Therefore, the phase difference T$d$ assumes a value including said error. Strictly speaking, the undesirable deflection referred to above, which occurs during the time the electron beam scans the mark, is different from that which occurs during pattern exposure. However, it can be assumed that the generated error is more or less the same for both the reference mark and the exposed area, since the reference mark 12 is located in the vicinity of said exposed area. Accordingly, a signal containing the error component (constituting the difference between the assigned and actual positions of the electron beam attributable to the aforementioned undesirable deflection, etc.) is produced as a signal designating the position of the reference mark. It is fed to the adding circuit 20. At the same time, a signal from the laser interferometer 21 is suplied to said adding circuit 20, said signal corresponding to the amount of stage shift, due to heat variation, etc. with respect to the reference mark. Furthermore, the amount of stage shift represents an error constituting the difference between the actual irradiating position of the electron beam in the workpiece and the assigned position of the electron beam. The adding circuit now adds the signal from the mark position detecting circuit 16 (which contains the error between the specified position of the electron beam obtained as a reference concomitant with the reference mark and the actual irradiating position of the electron beam), and the signal from the laser interferometer (which represents the amount of stage shift with respect to the reference mark). By so doing, an output signal represents the relative positions of the electron beam and stage. An error signal is obtained by comparing said output signal with the previously determined reference signal from the control circuit 8 in the error detecting circuit 27. That is to say, said errors are those which combine the actual error relating to the difference between the position of the electron beam irradiating the workpiece and the specified position of said electron beam; i.e., the error attributable to undesirable electron beam deflection and the error attributable to stage shift. Accordingly, the error signal is supplied to the stage shifting mechanism 28 which operates to move the stage 3 in such a direction that the error is nullified. By so doing, the errors attributable to undesirable electron beam deflection and stage shift are nullified. Moreover, since error correction in the Y-direction is carried out after completion of error correction in the X-direction, conformity of the actual and specified electron beam irradiating positions is effected. Since the exposure area is intentionally changed by stage shift, the reference signal fed into the error detecting circuit 27 from the control circuit 8 must vary accordingly.

Figure 4:
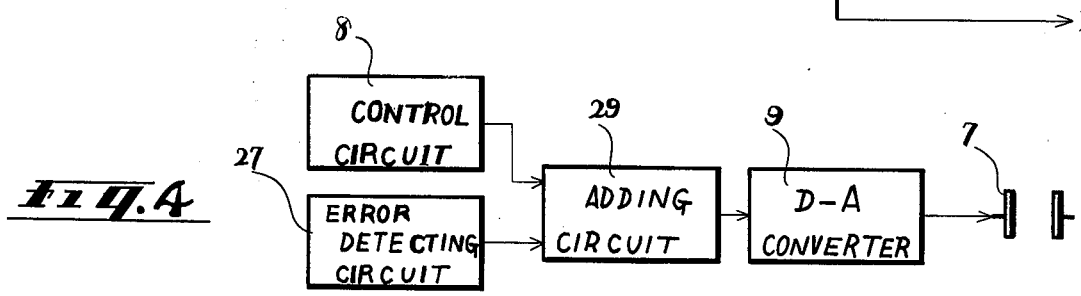
FIG. 4 is directed to an alternate error correction embodiment.

The subject invention is not limited to the precise above described embodiment; various alternatives are possible; for example, the error between the specified and actual positions of the electron beam irradiating the surface of the workpiece can be corrected by superimposing an error correcting signal, generated by the error detecting circuit 27, on the signal from the control circuit 8 in an adding circuit 29 and supplying the superimposed signals to the deflector 7 via the D-A converter 9 as shown in FIG. 4 instead of supplying the error signal to the stage shifting mechanism 28 as shown in FIG. 1. Alternatively, said correction can be accomplished by dispensing with the adding circuit 29 and providing an additional D-A converter and deflector. Furthermore, it is possible to combine the reference mark with the detector as one unit instead of having them separate as in the case of the above described embodiment. In this case, however, it will be necessary to fabricate the reference mark from a conductive material in order to be able to detect the electron beam current.

Having thus described our invention with the detail and particularity as required by the Patent Laws, what is desired protected by Letters Patent is set forth in the following claims.

1. In an electron beam exposure system comprising an electron beam source and an electron optical system for converging and deflecting the beam, an automatically positionable workpiece stage and control means for positioning the electron beam and the workpiece stage the improvement comprising:
    (a) a reference mark positioned in the vicinity of the workpiece exposure area fixed relative to the optical system,
    (b) first means for measuring a distance from the reference mark to a reference point in the electron beam raster by scanning the beam over the reference mark,
    (c) second means for measuring a distance between the reference mark and a reference point fixed relative to the workpiece,
    (d) means for combining the outputs of the first and second measuring means and comparing to a reference signal to develop an error signal, and
    (e) means associated with said control means for changing the electron optical system conditions and/or the workpiece position to eliminate the error signal.

2. The improvement in claim 1 wherein the second means is a laser interferometer.

3. An electron beam exposure system comprising:
    (a) an electron beam generating source,
    (b) an electron optical system for converging the electron beam generated by the electron beam generating source on a workpiece,
    (c) a deflecting means for deflecting the electron beam so as to shift the electron beam irradiating position on the workpiece,
    (d) means for blanking the electron beam, to prevent it from irradiating the workpiece,
    (e) a shifting mechanism for mechanically shifting a stage on which the workpiece is mounted,
    (f) a circuit for supplying control signals to said deflecting means, said control signals assigning a beam position on the basis of initial conditions, control signals to said blanking means and control signals to said shifting mechanism so that a certain pattern area on the workpiece is exposed to the electron beam,
    (g) a reference mark arranged above and away from, but in the vicinity of the workpiece exposure area,
    (h) a first measuring means for measuring the position of the electron beam at an assigned beam position with respect to said reference mark,
    (i) a second measuring means for measuring the position of the workpeice with respect to said reference mark,
    (j) an adding means for adding the output signals of said first and second measuring means,
    (k) an error detecting means for detecting an error signal by comparing the output signal of said adding means with a reference signal supplied from said control circuit, and
    (l) a means for compensating the error between the assigned and actual positions of the electron beam relative to a position on the workpiece surface in accordance with the output signal of said error detecting means.

4. An electron beam exposure system according to claim 3 in which said compensating means incorporates a control means for controlling said shifting mechanism, in accordance with the output signal of said error detecting means.

5. An electron beam exposure system according to claim 3 in which said compensating means incorporates a control means for controlling said deflecting means or another deflecting means, in accordance with the output signal of said error detecting means.

6. An electron beam exposure system according to claim 3 in which said second measuring means incorporates a Michelson type interferometer, said interferometer being comprised of a laser light source and one mirror fixed to the support bracket supporting said reference mark, and another mirror fixed to the stage on which the workpiece is supported.

7. An electron beam exposure system according to claim 3 in which said first measuring means incorporates a deflecting means for deflecting the electron beam on said reference mark, a detecting means for detecting the signals emitted from the reference mark, and a measuring means for measuring the time interval from the start time of the deflecting signal for sweeping said reference mark until said detecting means generates an output signal.

8. An electron beam exposure system according to claim 3 in which said electron optical system is controlled in such a way that the electron beam focuses on said reference mark during the operating time of said first measuring means.

* * * * *